United States Patent [19]

Miles et al.

[11] Patent Number: 5,051,097

[45] Date of Patent: Sep. 24, 1991

[54] SHAPE-MEMORY METAL CORE ELECTRICAL CONTACTOR

[75] Inventors: Robert S. Miles, Monrovia; Gustav A. Schmidt, South Pasadena, both of Calif.

[73] Assignee: Hughes Aircraft Company, Los Angeles, Calif.

[21] Appl. No.: 542,561

[22] Filed: Jun. 25, 1990

[51] Int. Cl.⁵ ............................................. H01R 9/09
[52] U.S. Cl. ...................................... 439/75; 439/161
[58] Field of Search .......................... 439/74, 75, 161; 29/830, 845; 174/DIG. 8

[56] References Cited

U.S. PATENT DOCUMENTS

| | | | |
|---|---|---|---|
| 3,217,283 | 11/1965 | Shlesinger, Jr. | 439/75 |
| 3,400,358 | 9/1968 | Byrnes et al. | 439/75 |
| 3,913,444 | 10/1975 | Otte | 174/DIG. 8 |
| 4,687,269 | 8/1987 | Dubertret et al. | 439/161 |
| 4,889,496 | 12/1989 | Neidich | 439/75 |

OTHER PUBLICATIONS

IBM Bulletin; Ecker; vol. 13; No. 4, p. 1016; 9-1970.

Kenneth Mason Publications Ltd., England; Disclosure No. 305; Solderless Spring/Pin Connector, 9-1989.

Primary Examiner—Neil Abrams
Attorney, Agent, or Firm—Terje Gudmestad; Jeannette M. Walder; W. K. Denson-Low

[57] ABSTRACT

A three dimensional stack of printed circuit assemblies (10,12) provides electrical interconnection or bussing between layers of the stack by means of a composite contactor (34, 35, 36, 77, 79, 81, 83) formed of a shape-memory core (90) having a number of highly electrically conductive resilient wires (92, 94) wrapped around it. The shape-memory core (90) has a low temperature configuration that is substantially straight and enables the contactor assembly or core (90) and wires (92, 94) to be inserted into vias (30, 31, 76, 78, 80, 82) extending through this stack of layers with little or no insertion force. When heated above its phase change temperature, the shape-memory core (90) assumes a sinuous configuration which tightly presses the encircling conductive wires (92, 94) against the electrically conductive interior surfaces of the vias (30, 31) to provide mechanical and electrical contact from layer to layer.

10 Claims, 2 Drawing Sheets

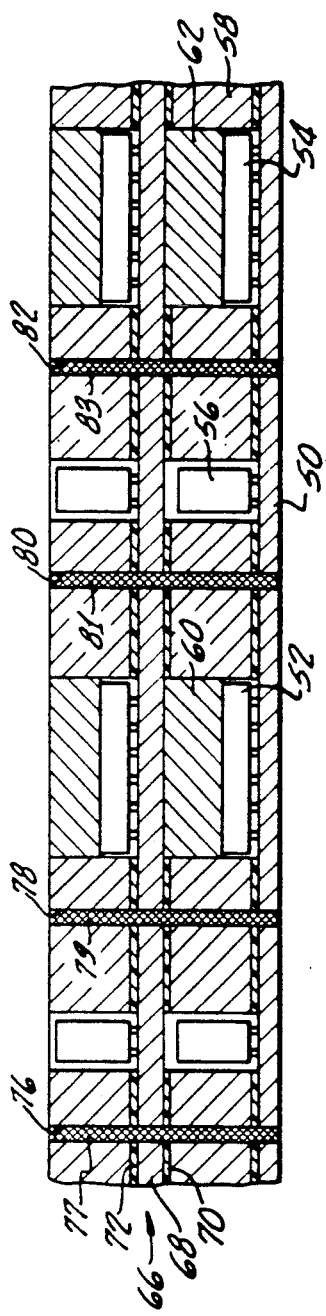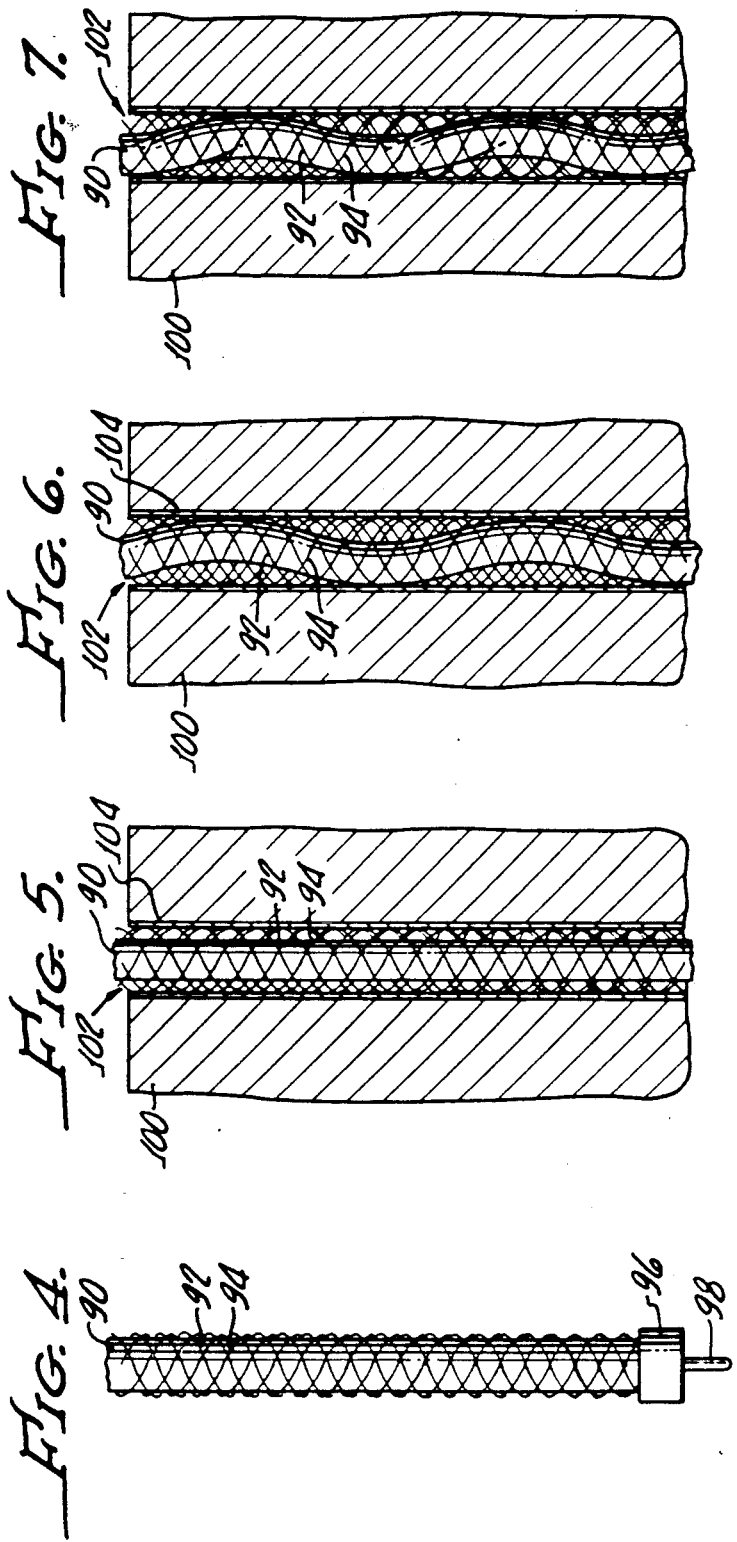

SHAPE-MEMORY METAL CORE ELECTRICAL CONTACTOR

BACKGROUND OF THE INVENTION

1. Field of the Invention

The present invention relates to packaging of electronic components and more particularly concerns a three dimensional stack of electronic component layers having improved electrical current conduction between layers of the stack.

2. Description of the Related Art

High density packaging of electronic components and assemblies for various purposes is becoming more desired in many applications where space is limited. One method of efficiently packaging such assemblies is to provide individual planar printed circuit assemblies or individual planar multi-chip module assemblies, each on a separate layer or disc, and to stack a number of such layers or discs to provide a three dimensional electronic assembly. Such an arrangement is considerably more compact than the conventional single or double sided circuit board assembly where essentially all of the components lie in one or two planes.

Although the desirability of such three dimensional stacks of planar assemblies has been recognized, reliable arrangements for electrical interconnection of the individual layers of the stack have not been realized. Prior attempts to solve these problems have included solder, fixed interconnect wires, mating conventional electrical connections, metal on elastomer compressible contactors, button board contactors, and micro springs.

All of these methods have significant problems, particularly when applied to systems that may be expected to experience demanding environmental conditions, including high temperature, high acceleration and vibration. Among other disadvantages, many of the prior interconnecting devices and arrangements make the three dimensional assemblies difficult to assemble and disassemble for repair or replacement of parts. Reliable and separable connections between and among individual stacked planar packaging elements have not been heretofore available.

Accordingly, it is an object of the present invention to provide a compact, three dimensional electronic assembly that avoids or minimizes above mentioned problems.

SUMMARY OF THE INVENTION

In carrying out principles of the present invention in accordance with a preferred embodiment thereof a composite electrical contactor for a three dimensional electrical assembly comprises an elongated core of a material having a shape-memory and having an electrically conductive elastic layer or sleeve encircling the core. The sleeve may be formed of a number of turns of highly electrically conductive resilient wire that is wrapped around the core. The core has a low temperature (below its phase change temperature) transverse dimension that is small enough to be readily received within an elongated space defined by an elongated space boundary, such boundary being defined by vias that extend through the stack. Above its phase change temperature, the core configuration and transverse dimension are significantly greater so that it will press the encircling conductive sleeve tightly against the conductive walls of the via.

BRIEF DESCRIPTION OF THE DRAWINGS

In the accompanying drawings:

FIG. 3 is a fragmentary sectional view of an assembly of a plurality of exemplary layers of a stack;

FIG. 4 illustrates a contactor assembly embodying principles of the present invention, in straightened shape;

FIG. 5 illustrates the contactor of FIG. 4, in straightened shape, inserted in a via;

FIG. 6 shows the arrangement of FIG. 5 with the contactor assembly in recovered high temperature configuration; and FIG. 7 illustrates a modified high temperature configuration of contactor assembly core.

DESCRIPTION OF THE PREFERRED EMBODIMENT

Figure 1:
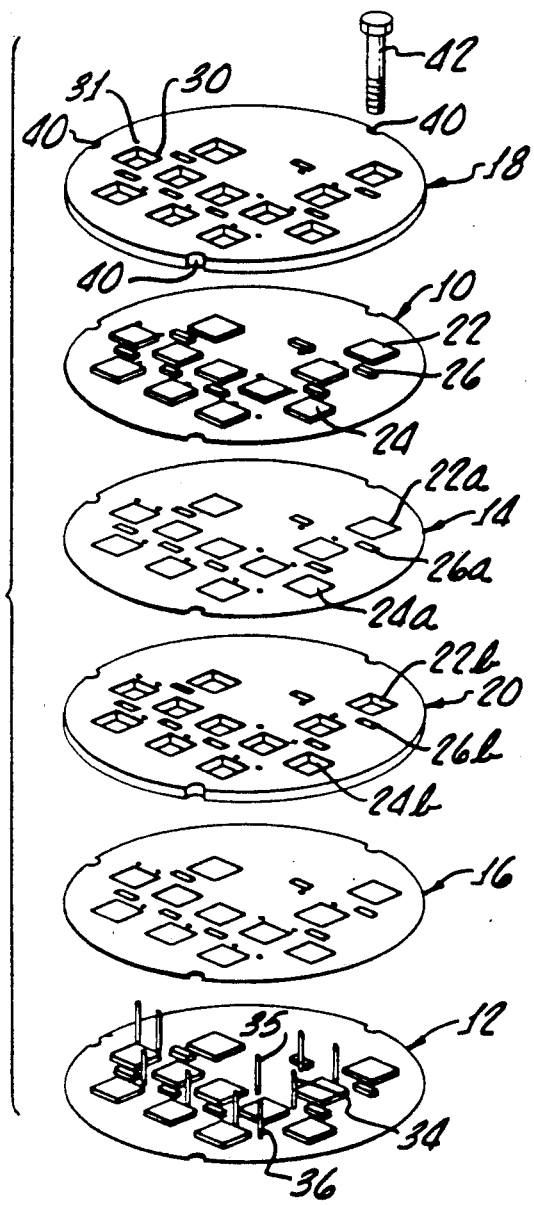
FIG. 1 is an exploded perspective view of portions of a three dimensional stack of electrical components which may embody principles of the present invention used for Z axis electrical interconnection of layers.

As illustrated in FIG. 1, an exemplary form of three dimensional stacked assembly of planar multi-chip modules comprises a number of discs 10 and 12 comprising assemblies of substrates bearing electronic components or printed circuit arrangements. Interconnect membranes in the form of thin discs 14,16 are interposed between the component discs 10 and 12 and pairs of interconnect membranes and component discs are separated by non-conductive spacer discs 18,20. The particular nature of the component discs 10 and 12 may vary widely without departing from principles of the invention and may be individual planar printed circuit assemblies, planar multi-chip module assemblies, or the like. For example, components disc 10 may include a number of electrical components or integrated circuit chips 22,24 and other components such as capacitors or the like indicated at 26, for example.

The interconnect membranes 14,16 include electrical leads and plated bumps or pins on upper and lower surfaces (in some cases also extending between such upper and lower surfaces) that provide for connection between components on a component disc and may also provide electrical connections between components on one disc and components of another disc. The membranes are also provided with apertures 22a, 24a, 26a to receive chip components.

The dielectric spacers are provided with suitable apertures 22b, 24b, 26b to receive the components mounted on the surface of the component discs 10 and 12. All of the discs and membranes are mutually aligned and have apertures aligned with one another and in registration with one another for appropriate interconnection and compact nesting in the vertical or Z axis direction of the stack.

A plurality of apertures, such as apertures 30,31 of spacer 18, and corresponding registered apertures of the other spacer discs, component discs and interconnect membrane discs, are provided to afford additional interconnection or electrical signal paths in the Z axis direction (vertical, as viewed in FIG. 1) from one disc to another or through the entire stack. These mutually registered and aligned apertures, in assembled condition of the stack, provide elongated cylindrical passages, termed "vias", some of which are continuous and may extend entirely through the stack.

Contactor assemblies of the present invention, such as assemblies 34,35 and 36 are among those illustrated in FIG. 1. In assembled condition the contactor assemblies extend through the vias, as will be more particularly described below.

Figure 2:
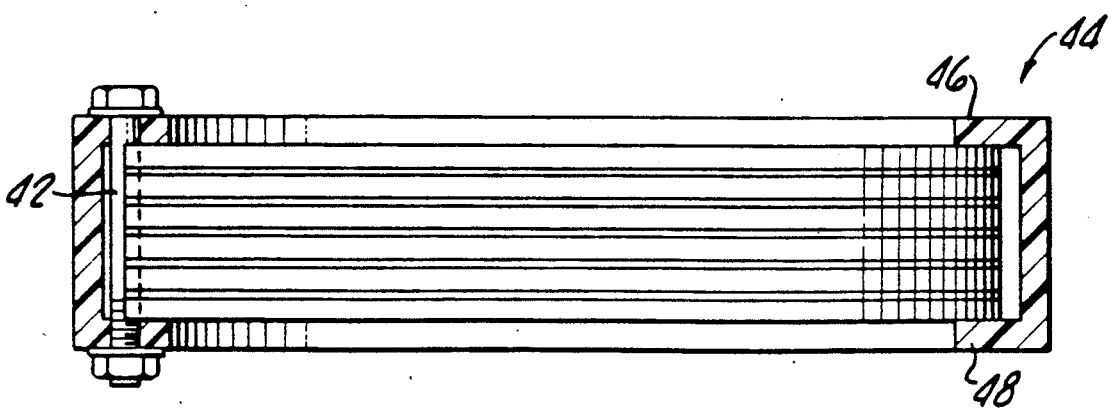
FIG. 2 is a side elevational view of an assembly of stacked layers.

Each of the discs has a plurality (such as three in the illustrated embodiment) of circumferentially spaced recesses or notches 40 formed in outer peripheral edges for location of a bolt, such as bolt 42, which extends through a clamping edge ring structure generally indicated at 44 and illustrated in FIG. 2. The clamping edge ring structure 44 has upper and lower annular flanges 46,48, which are open centered, and thus overlap only a small peripheral portion of the edges of the upper and lowermost discs of a stack. The flanges are apertured to receive the clamping bolts, such as bolt 42, to thereby hold the stack in fully assembled condition. Although FIG. 1 illustrates one pair of component assembly discs, one pair of membranes and one pair of spacers, it will be readily appreciated that larger numbers of stacked discs, membranes and spacers may be employed. Thus in some stacks contemplated there may be as many as fifteen planar component assemblies with corresponding numbers of interposed spacer and interconnect discs.

It will be understood that the structure and configuration of the various discs may be widely varied, depending upon the application of the stack assembly. Nevertheless, illustrated in FIG. 3 is a fragmentary section, greatly enlarged, showing some layers of a stack that will afford a better understanding of the function and arrangement of the contactor assembly of this invention.

The fragmentary sectional view of FIG. 3 shows a substrate 50 of a component disc, bearing electronic components, such as semiconductor chips 52,54, and a chip capacitor 56. A spacer layer 58 includes apertures which accept the several components on the component layer and has portions of such apertures filled with a thermally enhanced filler, such as fillers 60 and 62. An interconnect membrane 66 is illustrated as formed of a layer of a material such as molybdenum 68 sandwiched between upper and lower polyamide coatings 70,72. Appropriate surfaces of the interconnect layer, as previously mentioned, are provided with plated bumps or pins (not shown) for providing various electrical contacts between and among elements of the electrical components.

Illustrated in FIG. 3 are vias 76, 78, 80 and 82 which extend through some or all of the layers, and, which, as previously described, are formed by mutually registering apertures of the several layers of the stack. The interior of the vias need not be metallized or coated with any electrically conductive material for those portions that extend through the non-conductive spacers. However, other portions of the vias, particularly those portions formed in and extending through the component assemblies and the interconnect membranes, may be metallized or otherwise coated with an electrically conductive material for reception of and electrical connection with generally cylindrical elongated contactor assemblies 77, 79, 81, 83 that will conduct electrical current from one layer to the next, or which, in some cases, will act as an electrical power buss feeding through many layers of the stack.

According to features of the present invention, contactor assemblies 77, 79, 81, 83 are configured and arranged to be inserted into one or more vias with a substantially zero insertion force, but which, nevertheless, provide good electrical interconnection between layers and permit ready removal of the contactors to allow for disassembly of the stack. FIGS. 4, 5 and 6 illustrate one such contactor assembly.

Referring now to FIG. 4, a typical contactor assembly embodying principles of the present invention comprises an elongated, generally cylindrical, solid core 90 formed of a shape-memory metal of known composition. Such shape-memory metals are comprised of alloys of nickel and titanium and include those fabricated by Memory Metals of Stamford, Conn., Beta Phase, of Menlo Park, Calif., Mitsubishi Heavy Industries of Tokyo, Japan, and Shape Memory Applications of Sunnyvale, Calif., among others. Shape memory material employed in the present invention has a phase change temperature below room temperature, although shape memory materials with other phase change temperatures may be employed.

A material is chosen that has a phase change temperature below the lowest temperature that the assembled stack may experience. A material having a phase change temperature of about $-70°$ C. is preferred for certain military applications. The shape memory material changes from a first or low temperature shape to a second or high temperature shape as the material temperature passes through the phase change temperature. Thus, shape-memory metal core 90 of the present invention has the substantially straight cylindrical configuration illustrated in FIG. 4 when the material is at a lower temperature, a temperature below its phase change temperature. At a temperature above its phase change temperature the core employed in the present invention has a sinuous or sinusoidal shape (see FIG. 6) so that its overall effective external diameter is significantly greater than its diameter at a temperature below its phase change temperature.

The core is closely encircled by a highly electrically conductive resilient and flexible layer or sleeve. As presently preferred this sleeve is formed by a plurality, such as, for example, six or seven, highly electrically conductive resilient wires, such as wires 92,94, which, for example, may be formed of gold plated beryllium/copper strands. The wires are resilient and are closely, but not tightly, spirally wrapped around the core for its full length.

The highly conductive sleeve is employed because shape-memory metals have a relatively poor electrical conductivity and to increase areas of contact with the via in high temperature configuration. One or both ends of the core are formed with an electrically conductive end connector 96 to which all of the wires 92,94 are connected. The connector has a connector pin 98 for connection of the contactor assembly to external elements.

FIG. 5 illustrates a layer 100 of a three dimensional stack having a via 102 defined by an internal cylindrical surface or boundary 104 that is electrically conductive. Thus the entire interior of the surface of the via 102 illustrated in FIG. 5 is metallized for electrical conduction. The via has an internal diameter that is substantially the same as or slightly larger than the maximum external diameter of the contactor assembly of core 90 and wires 92,94 when the core is in its low temperature, straightened configuration. This low temperature configuration is shown in FIG. 5, which illustrates the fact that the contactor assembly in its straightened condition can be readily inserted longitudinally into and through (and just as readily removed from) the metallized via, with substantially zero insertion force (e.g. substantially no force need be applied along the axis of the contactor assembly). As an example, the contactor assembly, in low temperature configuration, may have an external diameter in the order of about 0.015 inches, and the via a substantially equal or slightly greater internal diameter that enables the contactor assembly to be readily slipped into the via when the core is below it phase change temperature.

After the layers of the stack have been assembled, as illustrated in FIG. 2, with the contactor assemblies (at a temperature below their phase change temperature, and, therefore, in their straight, low temperature configuration) inserted in the vias, the contactor assemblies are allowed to warm up to room temperature. As the straight shape-memory core 90 warms up to room temperature (above its phase change temperature) it recovers its high temperature shape or at least tends to recover it shape, which in this case is fabricated to be a sinusoidal or other sinuous configuration, in a single plane containing the core axis. As the core returns to its sinuous high temperature configuration, its overall transverse dimension increases. The normal transverse dimension of the core in high temperature configuration is made to be equal to or somewhat greater than the internal diameter of the via so as to insure good and strong contact with the metallized internal boundary of the via. As the core warms and returns to its high temperature configuration, that is, to its somewhat sinusoidal high temperature configuration, it causes a radial expansion of the resilient sleeve and presses the many strands of electrically conductive wire against the metallized walls of the via. This action provides good firm electrical and mechanical contact, locking the contactor assembly in the via in good electrical contact therewith. This high temperature, assembled configuration is illustrated in FIG. 6.

To remove the contactor assembly it is only necessary to cool the shape-memory core below its phase change temperature, whereby the entire contactor assembly may be readily removed since there is little or no friction between the contactor assembly in low temperature configuration and the via walls.

As mentioned above, the wrapping wires 92 and 94 are resilient and flexible. Thus the sleeve formed by the wires is resilient so the wires and sleeve may be readily distorted together with the shape-memory core as the latter returns to its high temperature sinuous configuration. This resilience allows the wrapping wires 92,94 to remain closely encircling the core when the core changes to its low temperature configuration, thereby insuring that the overall effective contactor diameter in low temperature configuration will permit easy insertion and removal of the contactor from the via.

The resilient sleeve does not fit closely around the length of the core in its high temperature condition so that the sleeve contacts the via walls at areas between the "peaks" of the sinusoidal core at high temperature. Theoretically, without the sleeve, the sinusoidal core would contact the via, only at spaced points at the center of each bend. However, the resilient sleeve is stretched and expanded by the expanded transverse core dimension and makes good contact with the via walls over greatly increased areas along the longitudinal and circumferential extent of the via. A sleeve formed of a highly electrically conductive resilient polymeric material may be employed, alternatively, provided its volumetric coefficient of thermal expansion is not significantly greater than that of the core.

Use of a material that is readily inserted when cold and thermally expands after insertion and warming, instead of the shape memory core and resilient sleeve assembly described herein, is not satisfactory, partly because of the great difficulties in making such contactors properly fit vias that vary in diameter within usual manufacturing tolerances. The transverse dimensional change of the shape memory material is greater and ensures both adequately small low temperature transverse dimension and sufficient increase of transverse dimension to attain good electrical contact.

It will be appreciated that many different high temperature configurations of shape-memory cores may be employed, provided the low temperature configuration is of substantially straight cylindrical shape, as illustrated in FIG. 4. For example, as shown in FIG. 7, the high temperature configuration may be of a helical or spiral shape (e.g. three dimensionally sinuous) instead of the effectively planar sinusoidal shape of FIG. 6, thus tending to afford somewhat increased areas of contact between the wrapping beryllium/copper wires and the plated walls of the via. Similarly, the low temperature configuration of the core may be varied from the straight right circular cylindrical shape shown, as long as its maximum low temperature dimension, with its sleeve, can be inserted into the via with zero insertion force.

Disassembly of the stack may be required to replace a defective element of the three dimensional system. Disassembly is accomplished by removing bolts 42 and clamping structure 44, and cooling the electronic unit to a temperature below the shape-memory phase change temperature. At that temperature the shape-memory metal core straightens and releases the pressure of the contactor wires against the via walls, at which time the contactors can be extracted from the stack and the stack can be disassembled, repaired and then reassembled.

There has been described an improved contactor assembly providing a reliable zero insertion force contactor for making Z axis electrical interconnection within a three dimensional electronic module stack and which may be readily removed for disassembly and repair.

What is claimed is:

1. A composite electrical contactor for an electrical assembly comprising:
    an elongated core of a material having a shape-memory, and a phase change temperature, said core having a low temperature maximum transverse dimension, below said phase change temperature, that is readily received within an elongated space defined by an elongated boundary having a predetermined transverse dimension, said core having an external configuration, above said phase change temperature, that has a high temperature transverse dimension greater than said low temperature maximum transverse dimension, and
    a flexible electrically conductive layer encircling said core, whereby said core and layer may be readily inserted into and removed from said space when temperature of said core is below said phase change temperature, and whereby said layer is pressed transversely outwardly against the boundary of said space when temperature of said core is above said phase change temperature, wherein said layer comprises a sleeve formed of a plurality of electrically conductive wires wrapped around said core.

2. The contactor of claim 1 wherein said wires are resilient.

3. The contactor of claim 1 wherein said core has a substantially straight cylindrical shape below said phase change temperature and a sinuous shape above said phase change temperature.

4. A three dimensional electronic component assembly comprising:

a plurality of substantially planar component assemblies' a plurality of apertures extending through at least a group of said layers with apertures of the layers of said group being mutually aligned to form at least one via extending through the layers of said group, at least one of said vias having an electrically conductive coating; and an electrically conductive contactor in said one via in mechanical and electrical contact therewith, said contactor comprising:

an elongated core of a material having a shape-memory, and an electrically conductive flexible sleeve around said core, said core having a low temperature maximum transverse dimension that enable said contactor to be readily received within said one via when said core is below a phase change temperature thereof, said core having a high temperature transverse dimension that causes said contactor to have a greater transverse dimension, when said core is at a temperature higher than said phase change temperature, that is greater than said maximum transverse dimension, whereby said core and sleeve may be readily inserted into and removed from said one via when temperature of said core is below said phase change temperature, and whereby said flexible sleeve is pressed transversely outwardly against the boundary of said via when temperature of said core is above said phase change temperature, wherein said sleeve comprises a plurality of electrically conductive wires wrapped around each core.

5. The assembly of claim 4 including a plurality of intermediate layers, said component assembly layers being stacked in consecutive alternation with said intermediate layers, at least some of said layers comprising an electrically non-conductive substrate.

6. The assembly of claim 4 wherein said core has a nearly straight longitudinal extent below said phase change temperature and has a longitudinally sinuous configuration above said phase change temperature.

7. The assembly of claim 4 wherein said core has a substantially straight longitudinal configuration below said phase change temperature and has a substantially helical configuration above said phase change temperature.

8. The assembly of claim 5 wherein alternate ones of said intermediate layers comprise electrically non-conductive spacers and interconnect membranes, said interconnect membranes including means for transmitting electrical current from one side thereof to the other, said one via extending through said membranes and spacers, said sleeve comprising means for transmitting electrical current from one of said membranes through one of said spacers.

9. The assembly set forth in claim 4 wherein said wires are formed of a resilient material, whereby said wires will tend to follow said core as it returns to its substantially straight longitudinal configuration at temperatures below its phase change temperature and will contact said one via over increased areas at temperatures above said phase change temperature.

10. A method of assembling a stack of electrical components comprising the steps of:

forming a plurality of layers of disc assemblies, each including a substrate having at least one electrical component and an aperture extending through the substrate, forming a plurality of intermediate layers having apertures extending therethrough, assembling said layers in a stack with the apertures of at least some of said individual layers in mutual alignment to define a continuous via extending through a plurality of said layers, forming an elongated core of a shape-memory material, wrapping a resilient sleeve of high electrical conductivity around said core to provide electrical contact, cooling said core below a phase change temperature of the core, said core having a substantially straight longitudinal configuration at a temperature below said phase change temperature, inserting said cooled core and sleeve through the aligned apertures of said plurality of layers, and warming said core to a temperature above said phase change temperature, said core having a sinuous configuration at a temperature above said phase change temperature, whereby said step of warming said core causes said core to press said sleeves against the interior of said via to provide firm mechanical and electrical connection between successive layers of said stack.

* * * * *